United States Patent [19]

Ichikawa et al.

[11] Patent Number: 4,481,675
[45] Date of Patent: Nov. 6, 1984

[54] PULSE DETECTING CIRCUIT OF RECEIVER FOR USE IN DIGITAL RADIO COMMUNICATION SYSTEM

[75] Inventors: Yoshio Ichikawa; Shinjiro Umetsu, both of Tokyo, Japan

[73] Assignee: Nippon Electric Co., Ltd., Tokyo, Japan

[21] Appl. No.: 339,632

[22] Filed: Jan. 15, 1982

[30] Foreign Application Priority Data

Jan. 26, 1981 [JP] Japan .................................. 56-9991

[51] Int. Cl.³ ............................................ H04B 1/16
[52] U.S. Cl. .................................. 455/343; 307/268; 307/352; 307/358; 328/164; 455/38
[58] Field of Search .................. 455/31, 35, 36, 38, 455/343; 340/825.44, 825.48, 311.1; 375/76; 328/164; 307/352, 358, 268, 296 A

[56] References Cited

U.S. PATENT DOCUMENTS 3,692,983  9/1972  Cucciati et al. ..................... 307/358
3,774,114  11/1973  Dahlgren ............................. 455/343
4,194,153  3/1980  Masaki et al. ......................... 455/31

Primary Examiner—Marc E. Bookbinder
Attorney, Agent, or Firm—Blakely, Sokoloff, Taylor & Zafman

[57] ABSTRACT

In a pulse detector of a receiver for use in a digital radio communication system comprising a low pass filter supplied with an input signal, a first resistor and a capacitor which are connected in series between an output terminal of the low pass filter and ground to constitute a longer time constant integrating circuit, a second resistor connected in parallel with the first resistor through a switch controlled by a control input, the first and second resistors and the capacitor constituting a shorter time constant integrating circuit, and a comparator with one input connected to the output of the low pass filter and the other input to a juncture between the first and second resistors and the capacitor, the potential of the juncture being utilized as a reference potential of the comparator, there is provided a switch connected between the juncture and the ground in series with the capacitor. According to this invention, pulse detection can be made more accurately and power can be much more saved than a prior art pulse detecting circuit.

9 Claims, 13 Drawing Figures

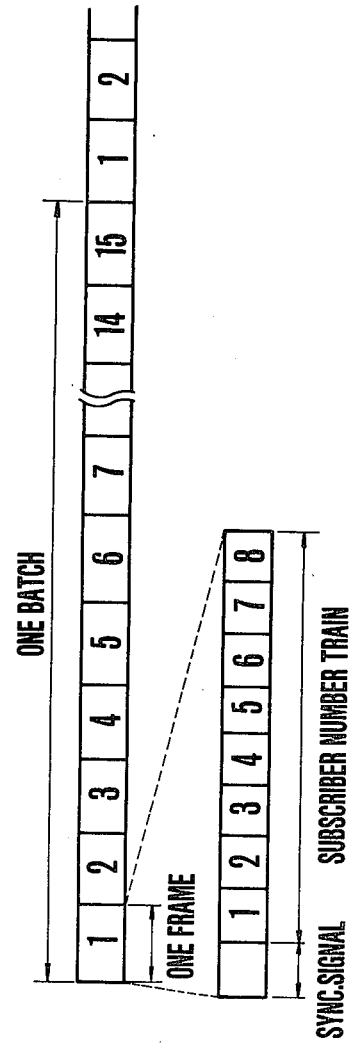
F I G. 3

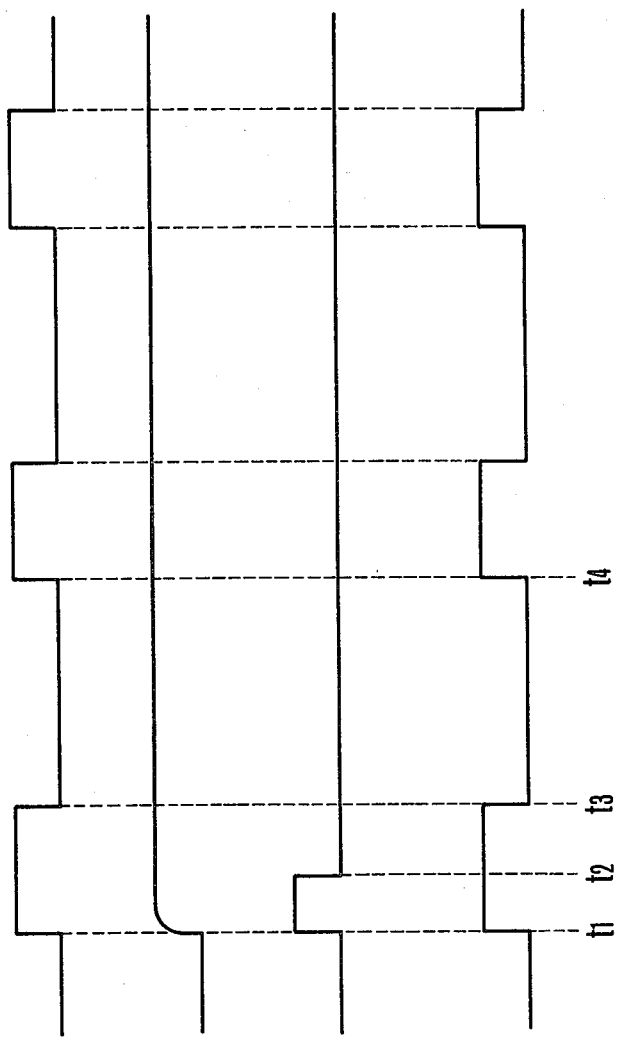

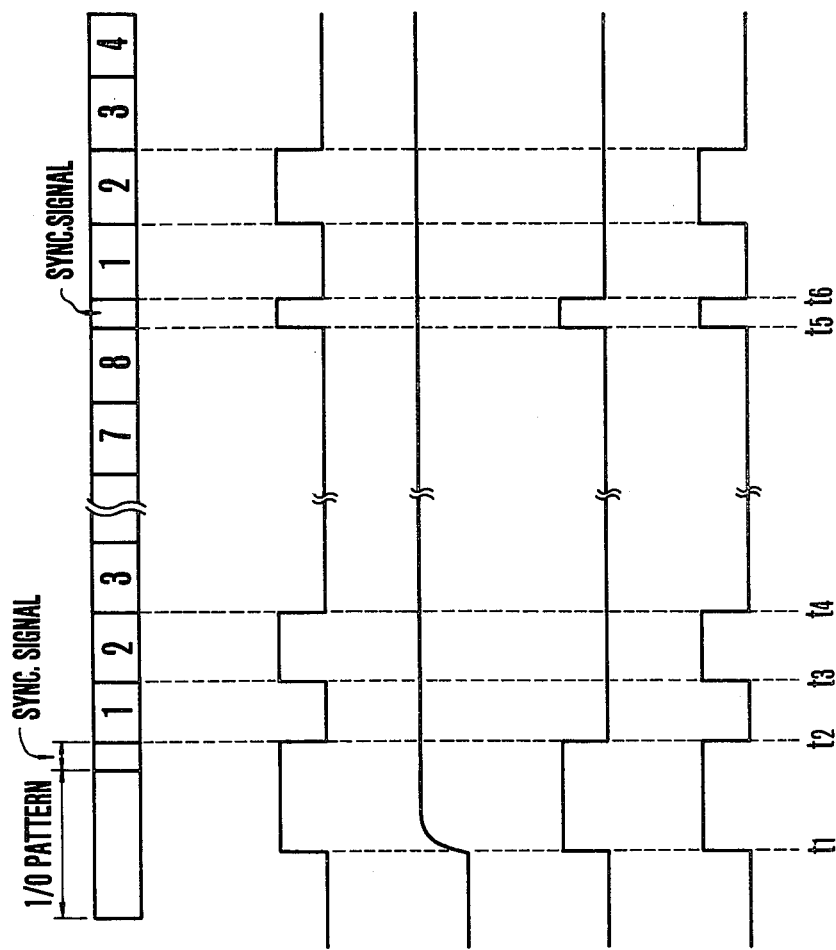

PULSE DETECTING CIRCUIT OF RECEIVER FOR USE IN DIGITAL RADIO COMMUNICATION SYSTEM

BACKGROUND OF THE INVENTION

This invention relates to a pulse detecting circuit of a receiver utilized in a digital radio communication system such as a mobile radio system or the likes.

In such a digital radio communication system as disclosed in U.S. Pat. No. 4,194,153 assigned to the same assignee as the present application, for the purpose of decreasing current consumption, the so-called battery saving system is generally used in which a power source of the receiver, for example, a personal radio paging receiver is periodically interrupted. As disclosed in U.S. patent application Ser. No. 240,873 filed Mar. 5, 1981, now U.S. Pat. No. 4,353,065 and assigned to the same assignee as the present application, the pulse detecting circuit utilized in the receiver comprises an integrating circuit for integrating an input signal and having two types of time constants, long and short, and a detecting circuit for detecting the input signal by utilizing the output of the integrating circuit as a reference voltage. In such a detecting circuit, at the time of closing a source switch, the integrating circuit is set up for the shorter time constant to shorten a time for establishment of the reference voltage in advance of the reception of the input signal, while at the time of receiving the input signal, the integrating circuit is set up for the longer time constant to alleviate the influence caused by the fluctuation in the DC level. However, as will be detailed later with reference to the drawings, even in such a pulse detecting circuit, accurate detecting operation and sufficient power saving of the receiver as a whole can not be assured dependent on the construction or format of the selectively received signal and the battery saving timing.

SUMMARY OF THE INVENTION

It is a principal object of this invention to provide an improved pulse detecting circuit of a receiver for use in a digital radio communication system capable of eliminating defects described above.

Specifically, an object of the invention is to provide a pulse detecting circuit which can operate correctly in the presence of a biassed 1/O code.

According to this invention there is provided a pulse detecting circuit of a receiver for use in a digital radio communication system in which a source of supply is periodically ON-OFF controlled, the pulse detecting circuit comprising first means including a capacitor for integrating an input signal, second means for detecting the input signal by utilizing an output of the first means as a reference voltage, and third means for holding the output of the first means when the source of supply is OFF.

BRIEF DESCRIPTION OF THE DRAWINGS

In the accompanying drawings:

FIG. 3 shows a construction or format of a selection signal utilized in a prior art paging system;

FIGS. 6a through 6d are timing charts showing signal waveforms at points a through d shown in FIG. 5; and FIG. 7a through 7d are timing charts showing signal waveforms at points a through d of the pulse detecting circuit shown in FIG. 5 at the time of receiving a POCSAG signal.

DESCRIPTION OF THE PREFERRED EMBODIMENT

Figure 1:
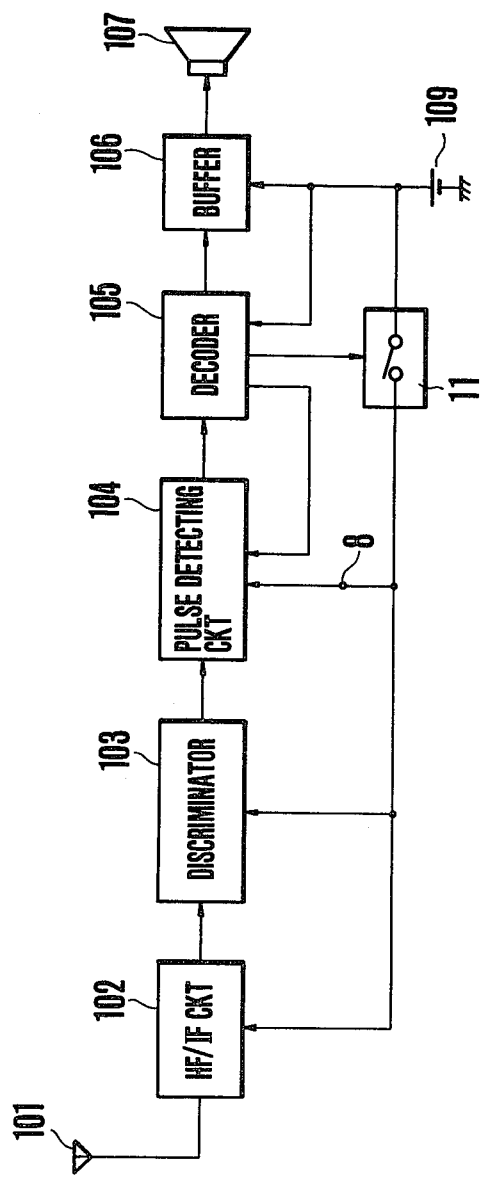
FIG. 1 is a block diagram showing a digital radio communication system, especially, a radio paging receiver to which the invention is applied.

Referring now to FIG. 1, there is shown a digital radio paging communication system, especially, its receiver of the battery saving type to which the present invention is applied. In the receiver, a radio wave received by an antenna 101 is amplified and frequency converted by a high frequency-intermediate frequency circuit and then applied to a discriminator 103 which demodulates the radio frequency signal and applies the demodulated signal to a pulse detecting circuit 104. The pulse detecting circuit 104 converts the demodulated signal into a pulse signal that can be judged by a decoder 105. The decoder 105 compares the detected pulse signal train with its own paging signal, and when they coincide with each other, the decoder 105 sends an alert signal to a buffer circuit 106 to produce an alert tone from a loudspeaker 107. A source switch 11 is provided to intermittently interrupt the power supply to the high frequency-intermediate frequency circuit 102, the discriminator 103 and the pulse detecting circuit 104 from a battery 109 in accordance with an output signal from the decoder 105 for saving the power consumption.

For better understanding of the invention, a prior art pulse detecting circuit disclosed in the aforementioned U.S. patent application Ser. No. 240,873 now U.S. Pat. No. 4,353,065 will first be described with reference to FIG. 2. As shown therein, a pulse detecting circuit 104 is constituted by a lowpass filter 1, a comparator 2, resistors 3, 4 and 5, a capacitor 6 and a switch 7. The capacitor 6 and the resistor 4 constitute a longer time constant path of an integrating circuit, while parallelly connected resistors 4 and 5, and the capacitor 6 constitute a shorter time constant path of the integrating circuit, thus producing two types of a reference voltage for the comparator 2. A terminal 8 is connected to the output side of the switch 11 shown in FIG. 1, while a terminal 9 is connected to receive the output of the decoder 105. When the source voltage is applied to the terminal 8 as a result of the closure of the switch 11, the switch 7 is closed by the control signal applied to the terminal 9 to set up the shorter time constant path, thus reducing the time for establishment of the reference voltage in advance of the reception of the input signal. After a definite time, the switch 7 is opened to set up the longer time constant path for decreasing the adverse effect caused by the fluctuation in the DC level at the time of signal reception. When constructing or formulating a selection signal for the paging receiver provided with such a pulse detecting circuit, it is necessary to add a signal train comprising not-biassed "1" and "0" before a subscriber number signal train in order to ensure that for stable operation of the pulse detecting circuit, the integrating circuit immediately begins to charge to form the reference voltage when the state of the source switch 11 is changed from OFF to ON.

To this end, the selection signal has a construction or format as illustrated in FIG. 3.

As shown, one batch of the signal is divided into 15 frames. Each frame is constituted by a one word synchronizing signal and a subscribed number train having several words. The receiver turns ON the switch 11 at the position of a frame assigned thereto so as to cause the integrating circuit to form the reference voltage for the comparator in accordance with the synchronizing signal including not-biassed "1" and "0".

Figure 4:
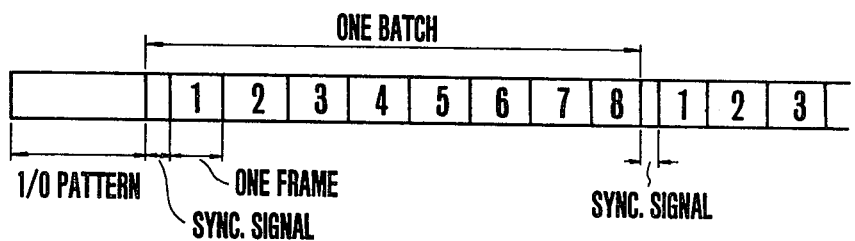
FIG. 4 shows a construction or format of a POCSAG (to be defined later) signal.

Incidentally, a selection signal described in a Report of the Studies of the British Post Office code Standardization Advisory Group (hereinafter called a POCSAG signal) published in June, 1978, comprises an 1/O pattern (termed a preamble signal) followed by a certain number of batches as shown in FIG. 4. One batch is constituted by a synchronizing signal and 8 frames, while one frame by a subscriber number train made up of several words. When such a POCSAG signal is received by the receiver utilizing the pulse detecting circuit, only one synchronizing signal is prepared for each batch so that there is no synchronizing signal for respective frames.

On the other hand, from the standpoint of the rising characteristic of the integrating circuit, it is necessary to close the switch 7 before the occurrence of a frame assigned to the given receiver. Under these circumstances, if the switch 7 is closed during, for example, one preceding frame to recharge the capacitor of the integrating circuit which has discharged by the opening of the source switch subsequent to the reception of the synchronizing signal and thereby to form the reference voltage, it will be impossible to obtain a correct value for the reference voltage of the pulse detecting circuit when a biassed 1/O code is present in the subscriber number. For this reason, in order to assure correct operation of the pulse detecting circuit, this circuit must be kept powered ON for all the frames after forming the reference signal according to the preamble signal of 1/O pattern and the synchronizing signal not subject to the biassed 1/O code. This greatly decreases the efficiency of power saving.

The invention contemplates elimination of such defects as above, and will now be described by way of example with reference to FIGS. 5, 6a through 6d and 7a through 7d.

Figure 2:
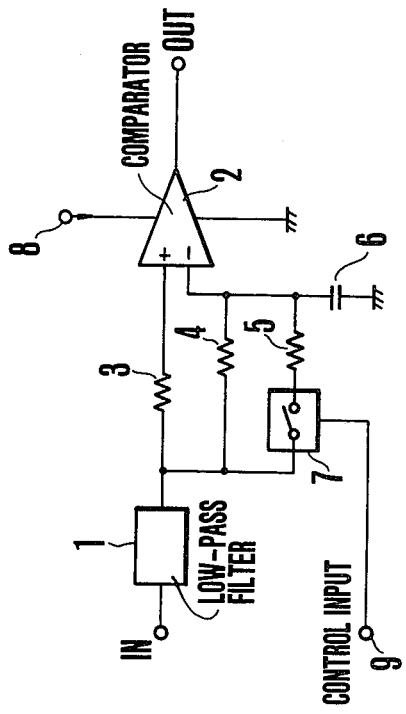
FIG. 2 is a connection diagram showing a conventional pulse detecting circuit.
Figure 5:
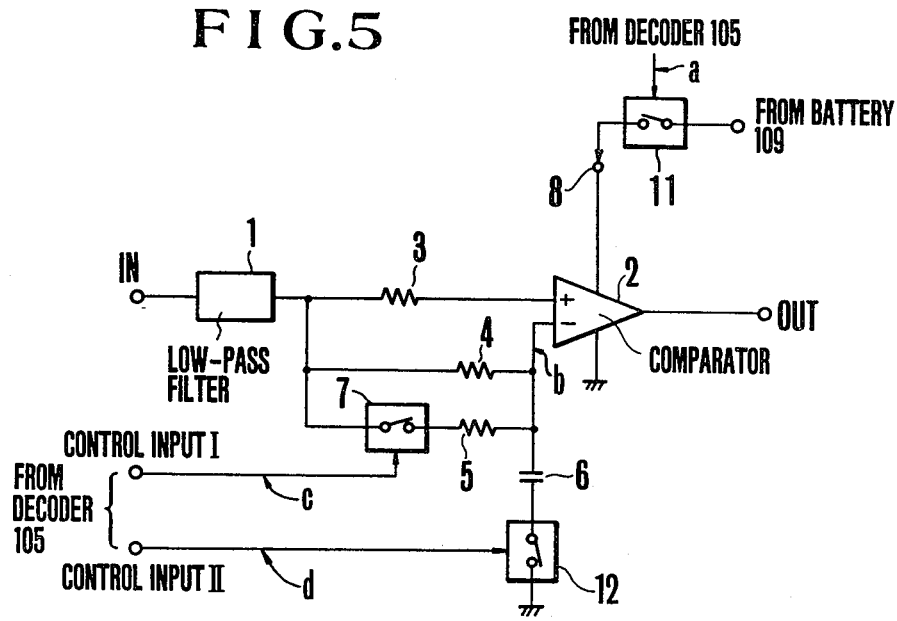
FIG. 5 is a connection diagram showing one embodiment of the pulse detecting circuit embodying the invention.

A pulse detecting circuit of this invention shown in FIG. 5 is characterized in that it is provided with a switch 12 not used in the prior art pulse detecting circuit shown in FIG. 2. FIGS. 6a through 6d show an operation timing chart of the main parts of the pulse detecting circuit when the source switch is opened and closed. The source of the pulse detecting circuit is ON-OFF controlled as shown in FIG. 6a. More particularly, concurrently with the closure of the source switch 11 at time t1, control inputs I and II are applied from a decoder 105, for example, to close switches 7 and 12 as shown in FIGS. 6c and 6d. Consequently, the shorter time constant path of the integrating circuit is set up and charged quickly. Thereafter, at time t2, the control input I is changed to a low level to open the switch 7 with the result that the longer time constant path of the integrating circuit is set up so as to apply a steady reference voltage (FIG. 6b) to the comparator 2 to detect "1" or "0" of the input signal. Then, when the source switch 11 is opened at time t3, the control input II also becomes the low level as shown in FIG. 6d to open the switch 12. Accordingly, the discharge circuit of the capacitor 6 is interupted to maintain the reference voltage (FIG. 6b) at a constant value. Then, when the source switch 11 is closed at time t4, the control input II changes to a high level to close the switch 12. However, the reference voltage is maintained at the constant value by the closure of the source switch (between t1 and t3), thus unnecessitating the charging time to ensure immediate detection of "1" or "0" of the input signal.

The switch 12 is connected between the capacitor 6 and ground in FIG. 5 for only illustration but obviously it may be connected between the junction of the capacitor 6 and resistor 5 and the capacitor 6.

One example of a case wherein the pulse detecting circuit shown in FIG. 5 receives the POCSAG signal is illustrated in FIGS. 7a through 7d. Thus, when the 1/O pattern is received at the time of closure of the source switch at time t1, the switches 7 and 12 are closed to form the shorter time constant path to rapidly charge the same. Since the subsequent synchronizing signal is also of the less biassed "1" and "0" code, the reference voltage for the comparator 2 will be formed before time t2 at which the synchronizing signal terminates. Thereafter, the source switch is held open until time t3 at which a frame (in this example, the second frame) assigned to the receiver begins. At the same time, switch 12 is opened to hold the charge of the capacitor 6, thereby maintaining the reference potential at the constant value. Before this time, the integration circuit is switched to the longer time constant path. A short time before the second frame, the source switch 11 is closed. Then, upon closure of the switch 12, it is possible to immediately detect the paging number. Where a plurality of batches continue in succession, by taking into consideration the variation of the reference voltage caused by a biassed code of the paging number, the connection is switched again to the shorter time constant path during the interval t5 to t6 of the next synchronizing signal in which the code is less 1/O biassed so as to correct the reference voltage. As a consequence, it becomes possible to stably receive the POCSAG signal. Moreover, since the source switch is closed only during a frame assigned to the receiver and during the synchronizing signal, the power consumption can be greatly decreased.

As above described, in accordance with this invention, in the digital radio paging receiver for intermittent power interruption, the pulse detecting circuit with the integrating circuit of different time constant paths additionally comprises the switch that holds the reference voltage so that once the capacitor of the integrating circuit has been charged, it becomes possible to save the time for charging the capacitor of the integrating circuit at the time of closing the source switch without disturbing the alleviation of the effect of the variation in the DC current level, thereby reducing the power consumption.

What is claimed is:

1. A pulse detecting circuit of a receiver for use in a digital radio communication system in which a power supply means for said receiver is periodically ON-OFF controlled by a control means, said pulse detecting circuit comprising:

a first means including a capacitor having a first and second terminal for integrating an input signal received by said receiver;

a second means for detecting pulses in said input signal by utilizing an output of said first means as a reference voltage; and a third means coupled to said first means for holding constant the output of said first means every time said source of power supply means is in an OFF state.

2. The pulse detecting circuit according to claim 1 wherein said first means comprises:

a first resistor having first and second terminals with said first terminal of said first resistor supplied with said input signal; and said first terminal of said capacitor coupled to said second terminal of said first resistor forming a junction between said second terminal of said first resistor and said first terminal of said capacitor, and said second terminal of said capacitor coupled to a point at a predetermined potential.

3. The pulse detecting circuit according to claim 2 wherein said third means comprises a switch coupled in series between said junction between said second terminal of said first resistor and said first terminal of said capacitor, and said point of predetermined potential.

4. The pulse detecting circuit according to claim 1, wherein:

said first means comprises a first resistor having first and second terminals with said first terminal coupled to said input signal, a second resistor coupled in parallel with said first terminal of said first resistor through a first switch controlled by a first control input, said first terminal of said capacitor coupled to said second terminal of said first resistor, thereby forming a junction therebetween, and said second terminal of said capacitor coupled to a point at a predetermined potential;

said second means comprises a comparator with a first input supplied with said input signal, and a second input for receiving said reference voltage, coupled to said second terminal of said first resistor; and said third means comprises a second switch controlled by a second control input, such that second switch and said capacitor are connected in series between said second terminal of said first resistor and said point of predetermined potential.

5. The pulse detecting circuit according to claim 4, further comprising means for providing said first and second control inputs upon the reception of said input signal.

6. The pulse detecting circuit according to claim 2, wherein said first means further comprises a second resistor coupled in parallel with said first resistor through a switch controlled by a control input.

7. The pulse detecting circuit according to claim 6, further comprising a means for providing said control input upon the reception of said input signal.

8. The pulse detecting circuit according to claim 1, further comprising a fourth means for feeding therethrough said input signal to said first means.

9. The pulse detecting circuit according to claim 8, wherein said fourth means comprises a lowpass filter.

* * * * *